United States Patent

Eckerlin

[15] 3,643,861

[45] Feb. 22, 1972

[54] FLUIDIC THRESHOLD GATE

[72] Inventor: Herbert M. Eckerlin, Raleigh, N.C.

[73] Assignee: Corning Glass Works, Corning, N.Y.

[22] Filed: Dec. 2, 1969

[21] Appl. No.: 881,537

[52] U.S. Cl. ....................235/201, 137/81.5

[51] Int. Cl. ....................G06d 5/00

[58] Field of Search ....................235/200, 201; 137/81.5

[56] References Cited

UNITED STATES PATENTS

| | | | |
|---|---|---|---|
| 3,327,725 | 6/1967 | Hatch | 235/201 |
| 3,495,776 | 2/1970 | O'Neill | 235/201 |
| 3,395,719 | 8/1968 | Boothe et al. | 137/81.5 |
| 3,503,423 | 3/1970 | Edell | 235/201 |

*Primary Examiner*—Richard B. Wilkinson
*Assistant Examiner*—Lawrence R. Franklin
*Attorney*—Clarence R. Patty, Jr., Walter S. Zebrowski and William J. Simmons, Jr.

[57] ABSTRACT

A fluidic logic gate utilizing the principles of threshold logic. This type of fluidic gate, which realizes complex logical functions with fewer gates than conventional fluidic logic gates, consists basically of the following types of components: diverters or fluidic inverters which perform a selective inhibit function, passive summing junctions, a proportional fluid amplifier and a threshold biased bistable fluid amplifier.

11 Claims, 6 Drawing Figures

INVENTOR.
Herbert M. Eckerlin
BY William J. Simmons, Jr.
ATTORNEY

FLUIDIC THRESHOLD GATE

BACKGROUND OF THE INVENTION

This invention relates to logic circuits employing pure fluid amplifiers and other pure fluid logic elements. More particularly, this invention relates to fluidic logic circuits which utilize the principles of threshold logic.

Pure fluid logic circuits are widely used in control and data processing systems. Since the fluid amplifiers and other pure fluid logic elements utilized therein are capable of withstanding extreme environmental conditions such as shock, high temperature, vibration and the like, and since their long lifetime permits the use thereof for long periods of operation, systems utilizing such components are preferred over electronic devices in many applications.

Although fluidic devices possess the above-noted advantages, they are relatively large and expensive. Conventional fluidic logic circuits which utilize components such as AND gates, NOT gates, OR gates, NOR gates, NAND gates and the like require a relatively large number of fluidic gates to perform given logic functions. Obviously, a fluidic logic circuit that could perform given logic functions with fewer gates would possess the additional advantages of reduced size, weight and cost.

SUMMARY OF THE INVENTION

It is therefore an object of the present invention to provide a fluidic logic gate which utilizes the principles of threshold logic. The utilization of this fluidic threshold gate reduces the total number of fluidic components necessary to perform given logical functions, thereby overcoming the above-noted disadvantages and increasing the practicality of fluidic systems.

Another object of the present invention is to provide a fluidic logic gate which singularly is capable of generating a large number of logical functions.

A further object of the present invention is to provide a fluidic logic gate which results in a significant reduction in the number of components required to perform specific logic functions.

Briefly, the fluidic threshold gate of this invention comprises a proportional fluid amplifier, the output of which is connected to one of the control passages of a bistable fluid amplifier. The remaining control passage of the bistable amplifier is connected to a source of fluid bias pressure. Passive summing means having a plurality of input passages and an output passage receives a plurality of fluid signals and provides at the output passage thereof a fluid signal that is proportional to the sum of the input signals. The output passage of the passive summing means is connected to an input terminal of the proportional amplifier. An output signal is obtained from the bistable fluid amplifier when the signal supplied thereto from the proportional amplifier exceeds the bias pressure.

The input signals applied to the passive summing means may be weighted, and they may be selectively inhibited. Also, a second passive summing means may receive and sum fluid signals and provide the proportional amplifier with a signal which acts in opposition to that provided by the first passive summing means.

Additional objects, features and advantages of the present invention will become apparent to those skilled in the art from the following detailed description and the attached drawings on which, by way of example, only the preferred embodiment of this invention is illustrated.

DESCRIPTION OF THE PREFERRED EMBODIMENT

Figures 1, 2, 3, 4, 5, 6:
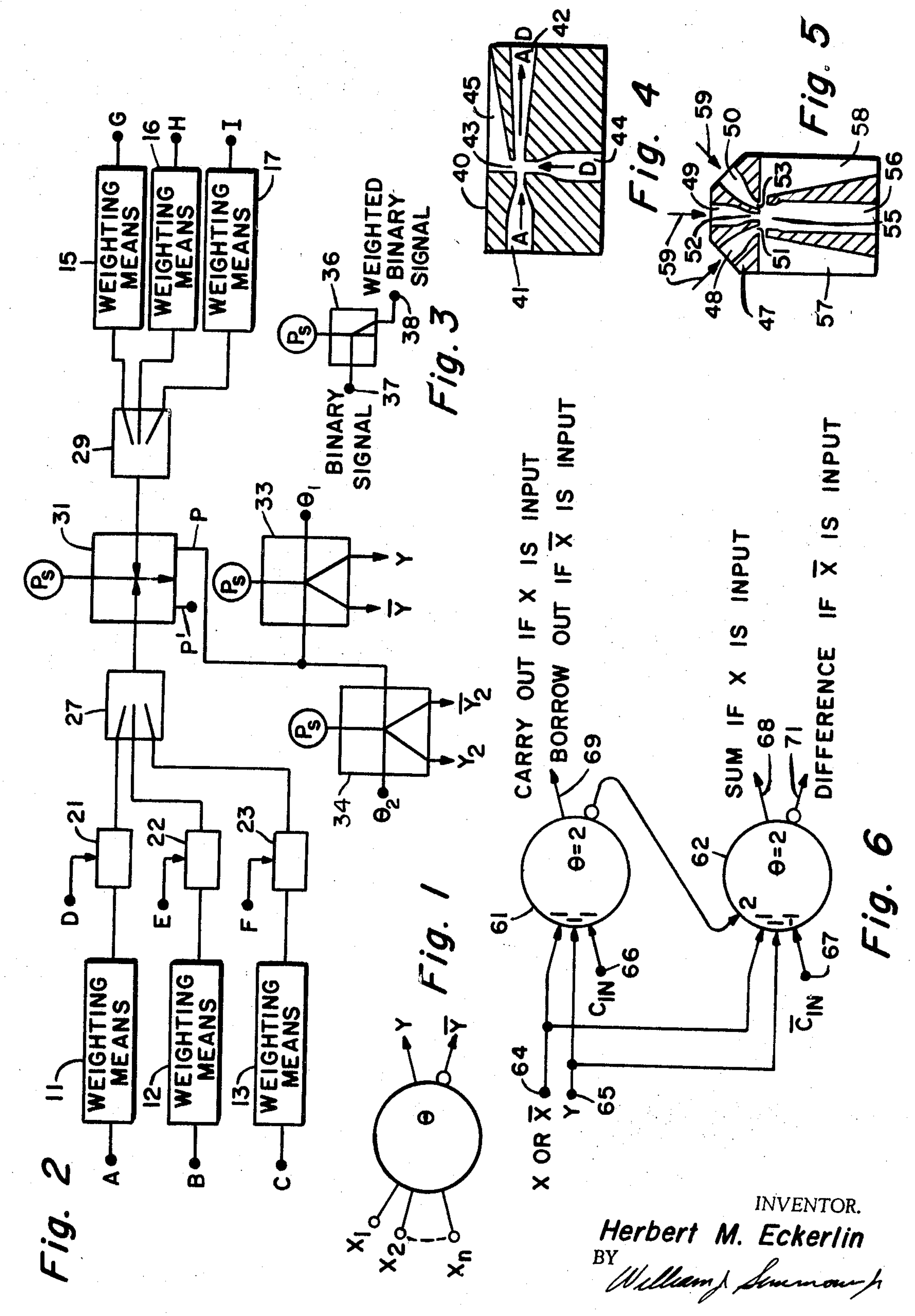
FIG. 1 is a symbolic representation of a fluidic threshold gate.
FIG. 2 is a schematic circuit diagram of the fluidic threshold gate of this invention.
FIG. 3 is a schematic representation of a fluidic device for weighting fluid signals.
FIG. 4 is a diagrammatic view in top plan of the fluid diverter employed in the threshold gate.
FIG. 5 is a diagrammatic view in top plan of the passive summing junction employed in the threshold gate.
FIG. 6 is a schematic diagram of an adder-subtracter circuit utilizing a plurality of threshold gates.

FIG. 1 schematically represents a threshold gate as a circle containing the symbol $\theta$ which is the threshold setting of the gate. The gate has n binary inputs, $X_1$, $X\theta$. . . $x_n$, and two binary outputs, Y and Y, where Y is the conventional logic designation for "not Y." Each of the inputs has associated therewith a Boolean value a, which may be 0 or 1, and a weight w, which can be any real number, positive, negative, or zero. Inputs with positive weights will be referred to as "excitatory," and those with negative weights will be referred to as "inhibitory." The value of any given input $X_i$ is determined by the product $(a \times w)$ for that input, and the total input to the gate is the algebraic sum of all the input products. If the total input is equal to or greater than the threshold, the output Y will be "1." If the total input is less than the threshold, the output Y will be "0." This can be summarized as follows:

If $$\sum_{i=1}^{n} a_i X_i w_i \geq \theta,\ Y=1;\ \bar{Y}=0$$

If $$\sum_{i=1}^{n} a_i X_i w_i < \theta,\ Y=0;\ \bar{Y}=1$$

Thus, the Y output of the gate is at the "1" level whenever the weighted sum of the inputs equals or exceeds the threshold.

The basic components of the threshold gate of this invention are schematically illustrated in FIG. 2. This gate comprises the following basic types of components, weighting means 11, 12, 13, 15, 16 and 17, diverters 21, 22 and 23, passive summing junctions 27 and 29, a proportional fluid amplifier 31 and bistable fluid amplifiers 33 and 34 connected as shown. For the purpose of illustration, the gate shown in FIG. 2 has nine inputs A through I; however, it is to be understood that a fluidic threshold gate in accordance with this invention can have any number of inputs. For example, each summing junction could have either more or less than the three inputs illustrated, or a plurality of summing junctions could be cascaded. The input signals A, B and C are called excitatory inputs and carry a positive weight. The input signals D, E and F, which are selective inhibitory inputs, and the input signals G, H and I, which are general inhibitory inputs, carry a negative weight. The actual weight associated with each input signal can be varied by changing the input pressure or by changing the input nozzle size as will be hereinafter described. The magnitude of the input signal pressure is equivalent to the logical weight assigned to that input by the weighting means. Since the generation of high frequency negative pressure pulses does not presently appear to be practicable, the weights of the inhibitory inputs are developed with positive pressure signals. With both excitatory and inhibitory inputs being introduced to the threshold gate at positive gage pressures, it is necessary to discriminate therebetween within the fluidic threshold gate itself. Thus, the excitatory and the general inhibitory input signals are independently summed, and their sums are compared by the proportional fluid amplifier 31, the output of which is proportional to the algebraic sum of the inputs applied to the two control passages thereof. The analog signal from the proportional amplifier is compared with a predetermined threshold pressure in the bistable fluid amplifier 33. If the analog signal exceeds the threshold level, the amplifier 33, and therefore the threshold gate has an output ($Y=1$), i.e., the pressure at the output terminal $Y$ becomes high.

The weighting means 11–13 and 15–17 may consist of fluidic elements of the type shown in FIG. 3. A binary fluid signal is applied to the control input passage 37 of a monostable fluid amplifier 36. The pressure of the fluid source $P_s$ is such that the desired weight is imparted to the binary signal. For example, the pressure of the signal applied to the passage 37 may be 1 p.s.i.g., and the pressure of the signal at the outlet passage 38 may be 2 p.s.i.g. In accordance with the usual operation of a monostable fluid amplifier, there is no signal at the passage 38 in the absence of an input signal. Although specific weighting means has been disclosed, it is obvious that the input signals can be weighted by other than the specifically disclosed means. Moreover, in some applications preweighted input signals are provided, and the threshold gate would therefore need no weighting means.

The three diverters 21, 22 and 23 are fluidic elements of the type illustrated in FIG. 4. The diverter consists of a base member 40 having fluid passages or channels in one surface thereof as shown by the areas which are not crosshatched. An input passage 41 is axially aligned with an outlet passage 42, these two passages being connected by a narrow interaction region 43. An inhibitory input passage 44 is joined to the region 43 at right angles to the passage 41. A vent passage 45 having diverging sidewalls communicates with the region 43 opposite the passage 44. An excitatory signal A passes directly through the diverter when the inhibitory signal D is not present. This generates the AND-NOT function $A\overline{D}$. When both A and D are present, the vector sum of their momenta directs the flow out the vent passage 45. Thus, the inputs A and D must be approximately at the same signal strength if the device is to operate in a digital fashion. If input A is not present, the state of the input D has no effect on the logic of the diverter. A major requirement of the diverter is high recovery of the power jet pressure. This is achieved by reducing the mixing area in the interaction region to a minimum. Furthermore, the recovered pressure of fluidic elements is generally a function of the load thereon. A highly acceptable recovery was obtained with this device. Since the terms contributing to the selective inhibitory function are easily identified and isolated from the total function to be realized, it is preferable to add a diverter to an excitatory input only when an occasion arises to use the selective inhibit function.

The passive summing junctions 27 and 29 are fluidic elements of the type illustrated in FIG. 5. This element consists of a base member 47 having channels or passages in the surface thereof which are illustrated as areas which are not crosshatched. Three input passages 48, 49 and 50 communicate with three nozzles 51, 52 and 53, respectively. The nozzles are so oriented that their center lines intersect within the entrance region 55 of an outlet passage 56. Two vent passages 57 and 58 having diverging sidewalls communicate with the region 55. The passive summing junction is very sensitive to loading; however, the vent passages 57 and 58 prevent feedback into the passages 48, 49 and 50 under large load conditions. As illustrated by the arrows 59, this element receives three digital input signals each having a discrete amplitude, and it generates an output signal proportional to the sum of the input signals. Thus, if each input is unique, a total of eight discrete output levels can be generated.

The proportional fluid amplifier 31 of FIG. 2 operates on a differential pressure basis. When the control pressures are equal, the fluid signals in the outlet passages are equal, and the differential output pressure is zero. By connecting the outlet passages of the passive summing junctions 27 and 29 to the opposed control input passages of the proportional fluid amplifier 31, as illustrated in FIG. 2, a comparison can be made between the sum of the excitatory inputs and the sum of the inhibitory inputs. An amplification of this comparison signal is simultaneously obtained with the signal comparison. The result of this comparison is indicated by the output of the fluid amplifier 31 and is proportional to the summation of all of the input signals to the threshold gate.

The output element of the fluidic threshold gate is a conventional bistable fluid amplifier 33. It receives from the proportional amplifier 31 a pressure signal P which is proportional to the summation of all of the inputs to the gate. It compares the signal P, which is applied to one of the control passages thereof with the threshold level $\theta$, which is introduced into the threshold gate as a bias pressure applied to the opposite control input passage. If the stepping signal P from the fluid amplifier 31 rises above the threshold level $\theta_1$, the amplifier 33 switches on and provides an output $Y=1$. If the signal P falls below the threshold level the $Y$ output then switches off and the amplifier 33 provides a signal $\overline{Y}=1$.

The signal P from the proportional amplifier 31 can also be connected to additional bistable fluid amplifiers such as the amplifier 34 having a threshold level $\theta_2$. One or more bistable fluid amplifiers could also be connected to the P′ output channel of the proportional fluid amplifier 31.

Since the input signals pass through various passive and active components before acting on the bistable fluid amplifier 33, the magnitude of the bias pressure applied thereto cannot be directly related to the magnitude of the input pressures. It is therefore necessary to define the threshold level in terms of the input states. If any one excitatory input is set at 1 p.s.i.g., and the bias pressure on the flip-flop is set as high as possible while still allowing the gate to switch, then this bias pressure is equivalent to a threshold level of 1. Threshold levels of 2 and 3 can be similarly defined by setting any one input at 2 or 3 p.s.i.g., respectively.

The operation of the fluidic threshold gate illustrated in FIG. 2 is as follows. The excitatory inputs A, B and C are introduced to the weighting means 11, 12 and 13, respectively, where these signals can be weighted as desired. The output signals from the weighting means are coupled to the diverters 21, 22 and 23, where they can be selectively negated by a selective inhibitory input D, E or F, respectively. The excitatory input signals pass from the diverter to the passive summing junction 27 where they are summed. The general inhibitory input signals G, H and I are applied to the input terminals of weighting means 15, 16 and 17, respectively. The weighting means output signals are summed in the passive summing junction 29. The two sums from the two summing junctions 27 and 29 are then compared by the proportional fluid amplifier 31 which also amplifies the resultant difference and provides an output signal P which is proportional to the sum of the excitatory and the inhibitory input signals. The output signal p is compared with the threshold level applied to the bistable fluid amplifier 33. If the signal from the proportional amplifier equals or exceeds the threshold level, the gate switches on and provides an output fluid signal $Y=1$ from the amplifier 33. Of course, in addition to the output function, the bistable amplifier 33 also generates $\overline{Y}$, the complement of the output signal.

The threshold gate described above offers a significant reduction in the number of fluidic components required to perform certain logic functions. Some of the basic functions of the gate will now be described. For purposes of this illustration, assume that all of the inputs have a weighting of 1. The general inhibitory signals G, H and I can each negate one of the excitatory input signals A, B or C. This is accomplished through the proportional amplifier 31, which compares the sum of the excitatory inputs with the sum of the inhibitory inputs. For the case wherein the weighting of all of the input signals is 1, it is seen that G+H+I negates A+B+C; GH+GI+HI negates AB+AC+BC; and GHI negates ABC, where + represents the logical OR function. A signal equivalent to a total input logical weight of +1 can be developed at the output of the proportional amplifier 31 in any of the following ways:

$$A+B+C=+1$$

$$(AB+AC+BC)\cdot(G+H+I)=+1$$

$$(ABC)\cdot(GH+GI+HI)=+1$$

This procedure can be extended to signal strengths of +2, +3 and the like.

The flexibility of the fluidic threshold gate can be best illustrated by the following examples. This gate is a generalization of both an OR and an AND gate. The OR function can be generated if the excitatory signals A, B, and C have a weight of 1 and the threshold $\theta$ is set equal to 1. Moreover, if the weights of the input signals A, B, and C are all set equal to 1 and the threshold $\theta$ is equal to 3, the gate generates the AND function. Therefore, by a simple change of the threshold setting, the output function is changed.

When the weights and threshold are chosen differently, the gate can realize more complicated functions. For example, if the weight of the input signal G is set equal to 2 and the weights of the signals B and C are set equal to 1, and the threshold $\theta$ is set equal to 1, the function $Y=B\overline{G}+C\overline{G}$ can be realized.

A plurality of threshold gates can be combined to perform additional logic functions. As illustrated in FIG. 6 two threshold gates 61 and 62 of the type schematically represented in FIG. 1 can be interconnected to form a fluidic adder-subtracter. In binary arithmetic operations, a full adder sums three bits, two bits from the given order which are connected to terminals 64 and 65 and the possible carry bit from the previous order. The carry signal $C_{in}$ is coupled to the terminal 66 of the gate 61 whereas $\overline{C}_{in}$ is coupled to the terminal 67 of the gate 62. The outputs of the full adder are the SUM of the given order, which appears at the output terminal 68, and the $\text{CARRY}_{out}$ to the next higher order which appears at the output terminal 69. The logical equations for the adder are:

$$\text{SUM} = X\overline{Y}\overline{C}_{in}+\overline{X}Y\overline{C}_{in}+\overline{X}\overline{Y}C_{in}+XYC_{in} \quad (1)$$

$$\text{CARRY}_{out} = XY+XC_{in}+YC_{in} \quad (2)$$

The $\text{CARRY}_{out}$ is a simple majority function that can be realized by the threshold gate 61; all inputs have unity weight and the threshold is set at 2. Inspection of equation (1) shows that the SUM function of the adder is not unate in three variables and therefore cannot be generated by the single threshold gate 61. However, if the complement of $\text{CARRY}_{out}$ is used as the fourth input to the gate 62, a unate expression for the SUM can be developed. This function $$\text{SUM} = \overline{\text{CARRY}}_{out}\,(X+Y+C_{in})+XYC_{in}$$

is also a threshold function, and can be generated by the weight assignments:

$$X=Y=C_{in}=1,\ \overline{\text{CARRY}}_{out}=2,\ \theta=3.$$

The above realization has four excitatory inputs. This is incompatible with the above-described fluidic threshold gate, which can accept only three excitatory inputs. However, one of the inputs may be converted to a negative weighting, thereby yielding the realization: $X=Y=1$, $\overline{C}_{in}=-1$, $\overline{\text{CARRY}}_{out}=2$, $\theta=2$. This is simply accomplished by connecting the complement of the signal $C_{in}$ to an inhibitory input terminal 67 of the gate 62. Binary subtraction is similar to addition and is accomplished by full subtracters. Subtracters also have two outputs, the DIFFERENCE of the given order and the $\text{BORROW}_{out}$ to the next higher order. The logical equations for the subtracter are:

$$\text{DIFFERENCE} = X\overline{Y}\overline{B}_{in}+\overline{X}Y\overline{B}_{in}+\overline{X}\overline{Y}B_{in}+XYB_{in}$$

$$\text{BORROW}_{out} = \overline{X}Y+\overline{X}B_{in}+YB_{in}$$

A comparison of the logical equations for the adder and subtracter shows that the equations for SUM and DIFFERENCE are identical, since both $C_{in}$ and $B_{in}$ are inputs from a previous order. This implies that both functions can be realized from the same circuitry. Moreover, the equations for $\text{CARRY}_{out}$ and $\text{BORROW}_{out}$ are of the same form, and differ only in the variable X.

Using the basic adder module, the subtracter function can be generated as follows. From the logical equations it is seen that the basic difference between an adder and subtracter is in the $\text{CARRY}_{out}$ and $\text{BORROW}_{out}$ functions. If the threshold of the gate 61 is changed to 1, and the X input weight to −1, the $\text{CARRY}_{out}$ can be converted to the $\text{BORROW}_{out}$. Although this conversion is perfectly valid, it is not the simplest approach. As most fluidic elements exhibit output duality, the element which generates the function X also generates $\overline{X}$. Therefore, both X AND $\overline{X}$ are available as inputs to the threshold gate. If $\overline{X}$ replaces X as an input to the threshold gate, $\text{CARRY}_{out}$ is immediately converted to the $\text{BORROW}_{out}$ functions.

Since $\overline{\text{CARRY}}_{out}$ is used as an input to the threshold gate 62 which generates the SUM function, converting $\text{CARRY}_{out}$ to $\text{BORROW}_{out}$ changes the SUM to another function, say H. If $\overline{X}$ feeds both threshold gates of the adder, function H becomes:

$$H=\overline{\text{BORROW}}_{out}\,(\overline{X}+Y+B_{in})+\overline{X}\cdot Y\,B_{in}$$
$$=(X\overline{Y}+X\,\overline{B}_{in}+\overline{Y}\,\overline{B}_{in})\,(\overline{X}+Y+B_{in})+\overline{X}\,Y\,B_{in}$$
$$=X\,\overline{Y}\,B_{in}+X\,Y\,\overline{B}_{in}+\overline{X}\,\overline{Y}\,\overline{B}_{in}+\overline{X}\,Y\,B_{in}$$

It is seen that H is not the DIFFERENCE function. However, if the complement of H is taken, the DIFFERENCE is indeed realized. As the fluidic threshold gate generates both the function and its complement, the DIFFERENCE function is readily available at the output terminal 71 of the gate 62. Thus, FIG. 6 illustrates how a fluidic adder is converted to a fluidic subtracter by the simple change of one input variable. Other circuits utilizing the fluidic threshold gate of the present invention are disclosed in my copending Pat. applications Ser. Nos. 881,439 and 881,469 entitled "Fluidic Binary Comparitor Utilizing Threshold Gates" and "Fluidic Adder-Subtractor Utilizing Threshold Logic," respectively, filed on even date herewith.

Since it is not practical to attempt to list all of the possible functions that can be realized by the threshold gate of this invention, its versatility has been demonstrated by a few diverse types of functions.

I claim:

1. A fluidic threshold gate for generating a plurality of logical functions comprising a proportional fluid amplifier having at least one control input passage and at least one outlet passage, first input terminal means for receiving a first plurality of fluid signals, first passive summing means having a plurality of input passages and an output passage which is connected to said at least one control input passage of said proportional fluid amplifier, said summing means providing a fluid signal that is proportional to the sum of the fluid signals applied to the input passages thereof, coupling means for connecting said input terminal means to said plurality of summing means input passages, respectively, a first bistable fluid amplifier having first and second opposed control input passages and at least one outlet passage, said at least one outlet passage of said proportional fluid amplifier being connected to said first control input passage, and means for connecting a fluid bias pressure to said second control input passage, the particular logical function performed by said gate depending upon said fluid bias pressure.

2. A fluidic threshold gate in accordance with claim 1 wherein said proportional fluid amplifier includes a second control input passage disposed in opposition to said at least one control input passage, said threshold gate further comprising general inhibitory means connected to said second input passage for supplying an inhibitory fluid signal to said proportional fluid amplifier in opposition to the sum of said first plurality of fluid signals.

3. A fluidic threshold gate in accordance with claim 2 wherein said general inhibitory means includes second input terminal means for providing a second plurality of fluid signals, and second passive summing means having a plurality of input passages to which said second input terminal means are connected and an output passage which is connected to said second control input passage of said proportional fluid amplifier, said second summing means providing a fluid signal that is proportional to the sum of said second plurality of fluid signals.

4. A fluidic threshold gate in accordance with claim 1 wherein said coupling means includes weighting means connected to said first input terminal means for imparting discrete weights to said first plurality of fluid signals.

5. A fluidic threshold gate in accordance with claim 1 wherein said coupling means includes means for selectively inhibiting any of said first plurality of fluid signals.

6. A fluidic threshold gate in accordance with claim 5 wherein said coupling means further includes weighting means connected to said first input terminal means for imparting discrete weights to said first plurality of fluid signals.

7. A fluidic threshold gate in accordance with claim 6 wherein said proportional fluid amplifier comprises a second control input passage disposed in opposition to said at least one control input passage, said threshold gate further comprising general inhibitory means connected to said second input passage for supplying an inhibitory fluid signal to said proportional amplifier in opposition to said first plurality of fluid signals.

8. A fluidic threshold gate in accordance with claim 7 wherein said general inhibitory means includes second input terminal means for providing a second plurality of fluid signals, and second passive summing means having a plurality of input passages to which said second input terminal means are connected and an output passage which is connected to said second control input passage of said proportional fluid amplifier, said second summing means providing a fluid signal that is proportional to the sum of said second plurality of fluid signals.

9. A fluidic threshold gate in accordance with claim 8 which further comprises a second bistable fluid amplifier having first and second opposed control input passages and at least one outlet passage, said at least one outlet passage of said proportional fluid amplifier being connected to said first control input passage of said second bistable fluid amplifier and means for connecting a fluid bias pressure to said second control input passage of said second bistable fluid amplifier, the bias pressure applied to said second bistable fluid amplifier being different from that applied to said first bistable fluid amplifier.

10. A fluidic threshold gate in accordance with claim 9 wherein said weighting means comprises monostable fluid amplifier means having a control input, a stable outlet passage and an unstable outlet passage, said control input being connected to said input terminal means and said unstable outlet passage being connected to said selective inhibit means.

11. A fluidic threshold gate in accordance with claim 1 which further comprises a second bistable fluid amplifier having first and second opposed control input passages and at least one outlet passage, said at least one outlet passage of said proportional fluid amplifier being connected to said first control input passage of said second bistable fluid amplifier and means for connecting a fluid bias pressure to said second control input passage of said second bistable fluid amplifier, the bias pressure applied to said second bistable fluid amplifier being different from that applied to said first bistable fluid amplifier.

* * * * *